United States Patent
Chen et al.

(10) Patent No.: US 9,536,920 B2
(45) Date of Patent: Jan. 3, 2017

(54) STACKED IMAGE SENSOR HAVING A BARRIER LAYER

(71) Applicant: TAIWAN SEMICONDUCTOR MANUFACTURING COMPANY, LTD., Hsin-Chu (TW)

(72) Inventors: U-Ting Chen, Wanluan Township (TW); Shu-Ting Tsai, Kaohsiung (TW); Cheng-Ying Ho, Minxiong Township (TW); Tzu-Hsuan Hsu, Kaohsiung (TW); Shih Pei Chou, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 23 days.

(21) Appl. No.: 14/228,346

(22) Filed: Mar. 28, 2014

(65) Prior Publication Data
US 2015/0279891 A1    Oct. 1, 2015

(51) Int. Cl.
*H01L 27/146*    (2006.01)

(52) U.S. Cl.
CPC ..... *H01L 27/14636* (2013.01); *H01L 27/1464* (2013.01); *H01L 27/1469* (2013.01); *H01L 27/14634* (2013.01); *H01L 27/14687* (2013.01)

(58) Field of Classification Search
CPC ............ H01L 2924/01013; H01L 2924/01014; H01L 2924/01029; H01L 27/14636; H01L 27/1469; H01L 27/14634; H01L 27/14687; H01L 27/1464
See application file for complete search history.

(56) References Cited

U.S. PATENT DOCUMENTS

2012/0248580 A1* 10/2012 Matsugai ................ H01L 22/12
                                                                257/621
2012/0256319 A1* 10/2012 Mitsuhashi ................... 257/774

* cited by examiner

*Primary Examiner* — John P Dulka
*Assistant Examiner* — Charles R Peters
(74) *Attorney, Agent, or Firm* — Haynes and Boone, LLP

(57) ABSTRACT

An image sensor includes a sensor portion and an ASIC portion bonded to the sensor portion. The sensor portion includes a first substrate having radiation-sensing pixels, a first interconnect structure, a first isolation layer, and a first dielectric layer. The ASIC portion includes a second substrate, a second isolation layer, and a second dielectric layer. The material compositions of the first and second isolation layers and the first and second dielectric layers are configured such that the first and second isolation layers may serve as barrier layers to prevent copper diffusion into oxide. The first and second isolation layers may also serve as etching-stop layers in the formation of the image sensor.

20 Claims, 13 Drawing Sheets

STACKED IMAGE SENSOR HAVING A BARRIER LAYER

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels (which may include photodiodes and transistors) in a substrate to absorb (i.e., sense) radiation that is projected toward the substrate and convert the sensed radiation into electrical signals.

A back side illuminated (BSI) image sensor device is one type of image sensor device. These BSI image sensor devices are operable to detect light from the backside. Compared to front side illuminated (FSI) image sensor devices, BSI image sensor devices have improved performance, especially under low light conditions. However, traditional methods of fabricating BSI image sensor devices may still lead to certain shortcomings for BSI image sensor devices. For example, there shortcomings may pertain to lack of surface smoothness for metal lines and/or leakage current. These problems may be caused by undesirable copper diffusion into neighboring oxide, which may occur in BSI image sensor device fabricated using conventional methods. Hence, while existing BSI image sensor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
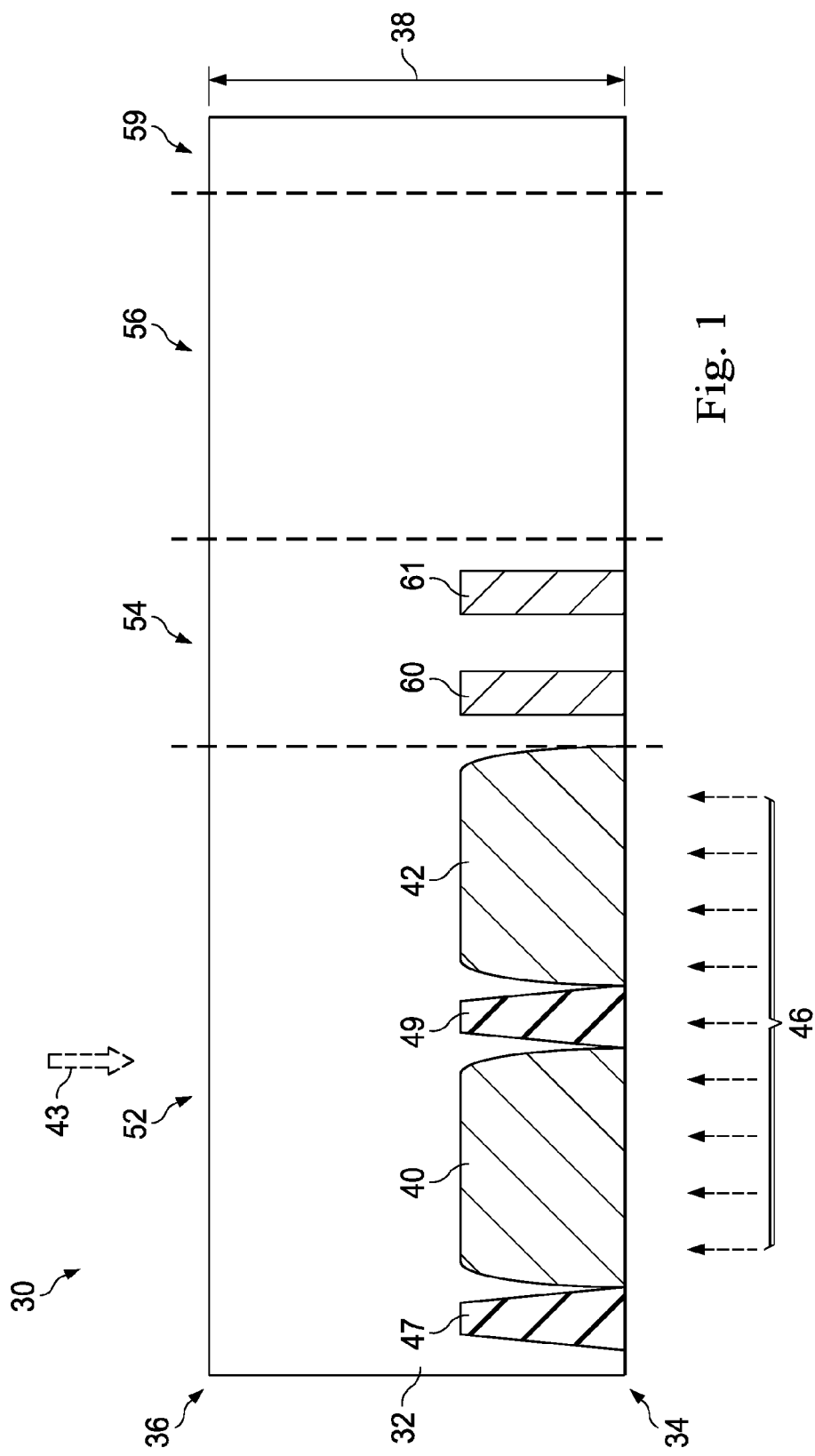
FIGS. 1-12 are simplified fragmentary cross-sectional side views of a portion of an image sensor device at various stages of fabrication in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1-12 are simplified diagrammatic fragmentary sectional side views a BSI image sensor device 30 at various stages of fabrication according to aspects of the present disclosure. The image sensor device 30 includes an array or grid of pixels for sensing and recording an intensity of radiation (such as light) directed toward a backside of the image sensor device 30. The image sensor device 30 may include a charge-coupled device (CCD), complimentary metal oxide semiconductor (CMOS) image sensor (CIS), an active-pixel sensor (APS), or a passive-pixel sensor. The image sensor device 30 further includes additional circuitry and input/outputs that are provided adjacent to the grid of pixels for providing an operation environment for the pixels and for supporting external communication with the pixels. It is understood that FIGS. 2 to 6 have been simplified for a better understanding of the inventive concepts of the present disclosure and may not be drawn to scale.

With reference to FIG. 1, the image sensor device 30 includes a sensor wafer 32. The sensor wafer 32 contains a silicon substrate doped with a p-type dopant such as boron (for example a p-type substrate) in the illustrated embodiment. Alternatively, the sensor wafer 32 could contain another suitable semiconductor material. For example, the sensor wafer 32 may include a silicon substrate that is doped with an n-type dopant such as phosphorous or arsenic (an n-type substrate). The substrate of the sensor wafer 32 could contain other elementary semiconductors such as germanium and diamond. The substrate of the sensor wafer 32 could optionally include a compound semiconductor and/or an alloy semiconductor. Further, the sensor wafer 32 could include an epitaxial layer (epi layer), may be strained for performance enhancement, and may include a silicon-on-insulator (SOI) structure.

Referring back to FIG. 1, the sensor wafer 32 has a front side (also referred to as a front surface) 34 and a back side (also referred to as a back surface) 36. The sensor wafer 32 also has an initial thickness 38 that is in a range from about 100 microns (um) to about 3000 um. In the present embodiment, the initial thickness 38 is in a range from about 500 um to about 1000 um.

Radiation-sensing regions—for example, pixels 40 and 42—are formed in the sensor wafer 32. The pixels 40 and 42 are configured to sense radiation, such as an incident light 43, that is projected toward sensor wafer 32 from the back side 36. The pixels 40 and 42 each include a photodiode in the present embodiment. In other embodiments, the pixels 40 and 42 may include pinned layer photodiodes, photogates, reset transistors, source follower transistors, and transfer transistors. The pixels 40 and 42 may also be referred to as radiation-detection devices or light-sensors.

The pixels 40 and 42 may be varied from one another to have different junction depths, thicknesses, widths, and so forth. For the sake of simplicity, only two pixels 40 and 42 are illustrated in FIG. 1, but it is understood that any number of pixels may be implemented in the sensor wafer 32. In the embodiment shown, the pixels 40 and 42 are formed by performing an implantation process 46 on the sensor wafer 32 from the front side 34. The implantation process 46 includes doping the sensor wafer 32 with a p-type dopant such as boron. In an alternative embodiment, the implantation process 46 may include doping the sensor wafer 32 with an n-type dopant such as phosphorous or arsenic. In other embodiments, the pixels 40 and 42 may also be formed by a diffusion process.

Referring back to FIG. 1, the sensor wafer 32 includes isolation structures—for example, isolation structures 47 and 49—that provide electrical and optical isolation between the pixels 40 and 42. The isolation structures 47 and 49 include shallow trench isolation (STI) structures that are formed of a dielectric material such as silicon oxide or silicon nitride. The STI structures are formed by etching openings into the substrate 32 from the front side 34 and thereafter filling the openings with the dielectric material. In other embodiments, the isolation structures 47 and 49 may include doped isolation features, such as heavily doped n-type or p-type regions. It is understood that the isolation structures 47 and 49 are formed before the pixels 40 and 42 in the present embodiment. Also, for the sake of simplicity, only two isolation structures 47 and 49 are illustrated in FIG. 1, but it is understood that any number of isolation structures may be implemented in the sensor wafer 32 so that the radiation-sensing regions such as pixels 40 and 42 may be properly isolated from one another.

Still referring to FIG. 1, the pixels 40 and 42 and isolation structures 47 and 49 are formed in a region of the image sensor device 30 referred to as a pixel region 52 (or a pixel-array region). The image sensor 30 may also include a periphery region 54, a bonding pad region 56, and a scribe line region 59. The dashed lines in FIG. 1 designate the approximate boundaries between the regions 52, 54, 56, and 59. The periphery region 54 includes devices 60 and 61 that need to be kept optically dark. For example, the device 60 in the present embodiment may be a digital device, such as an application-specific integrated circuit (ASIC) device or a system-on-chip (SOC) device. The device 61 may be a reference pixel that is used to establish a baseline of an intensity of light for the image sensor device 30.

The bonding pad region 56 includes a region where one or more bonding pads (not illustrated) of image sensor device 30 will be formed in a later processing stage, so that electrical connections between the image sensor device 30 and outside devices may be established. The scribe line region 59 includes a region that separates one semiconductor die (for example, a semiconductor die that includes the bonding pad region 56, the periphery region 54, and the pixel region 52) from an adjacent semiconductor die (not illustrated). The scribe line region 59 is cut therethrough in a later fabrication process to separate adjacent dies before the dies are packaged and sold as integrated circuit chips. The scribe line region 59 is cut in such a way that the semiconductor devices in each die are not damaged. It is also understood that these regions 52-59 extend vertically above and below the sensor wafer 32.

Figure 2:
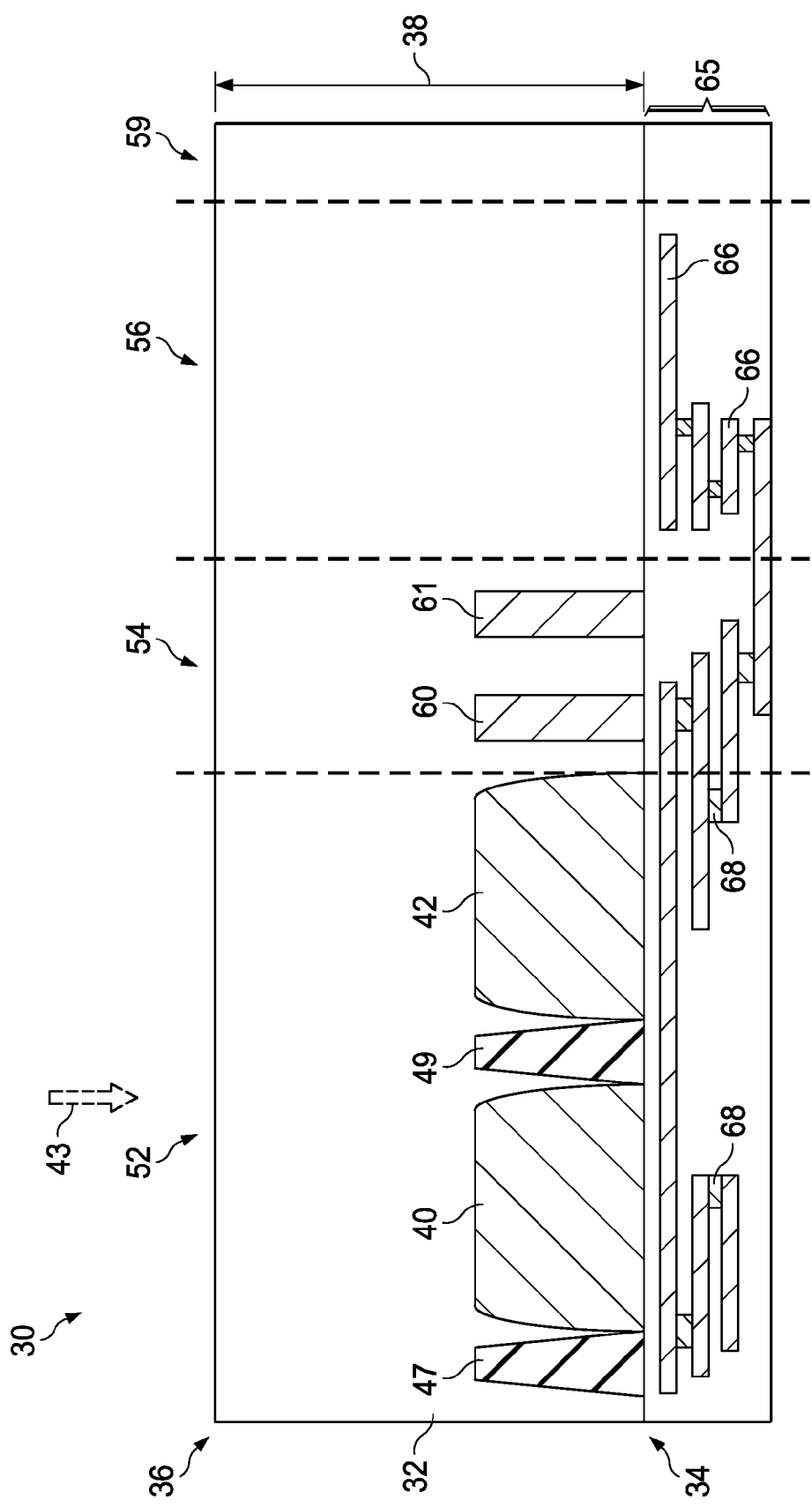

Referring now to FIG. 2, an interconnect structure 65 is formed over the front side 34 of the sensor wafer 32. The interconnect structure 65 includes a plurality of patterned dielectric layers and conductive layers that provide interconnections (e.g., wiring) between the various doped features, circuitry, and input/output of the image sensor device 30. The interconnect structure 65 includes an interlayer dielectric (ILD) and a multilayer interconnect (MLI) structure. The MLI structure includes contacts, vias and metal lines. For purposes of illustration, a plurality of conductive lines 66 and vias/contacts 68 are shown in FIG. 2, it being understood that the conductive lines 66 and vias/contacts 68 illustrated are merely exemplary, and the actual positioning and configuration of the conductive lines 66 and vias/contacts 68 may vary depending on design needs.

The MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts 68) and horizontal connection (for example, conductive lines 66). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Traditionally, after the formation of the interconnect structure 65, a carrier wafer is bonded to the sensor wafer 32 from the front side 34, and thereafter a back side thinning process will then be performed to thin the sensor wafer 32 from the back side. According to the various aspects of the present disclosure, however, an Application Specific Integrated Circuit (ASIC) wafer is bonded to the front side 34 of the sensor wafer 32 instead, rather than a carrier wafer. This is shown in FIG. 3, which is a more detailed cross-sectional side view of the periphery region 54 of the image sensor device 30.

Figure 3:
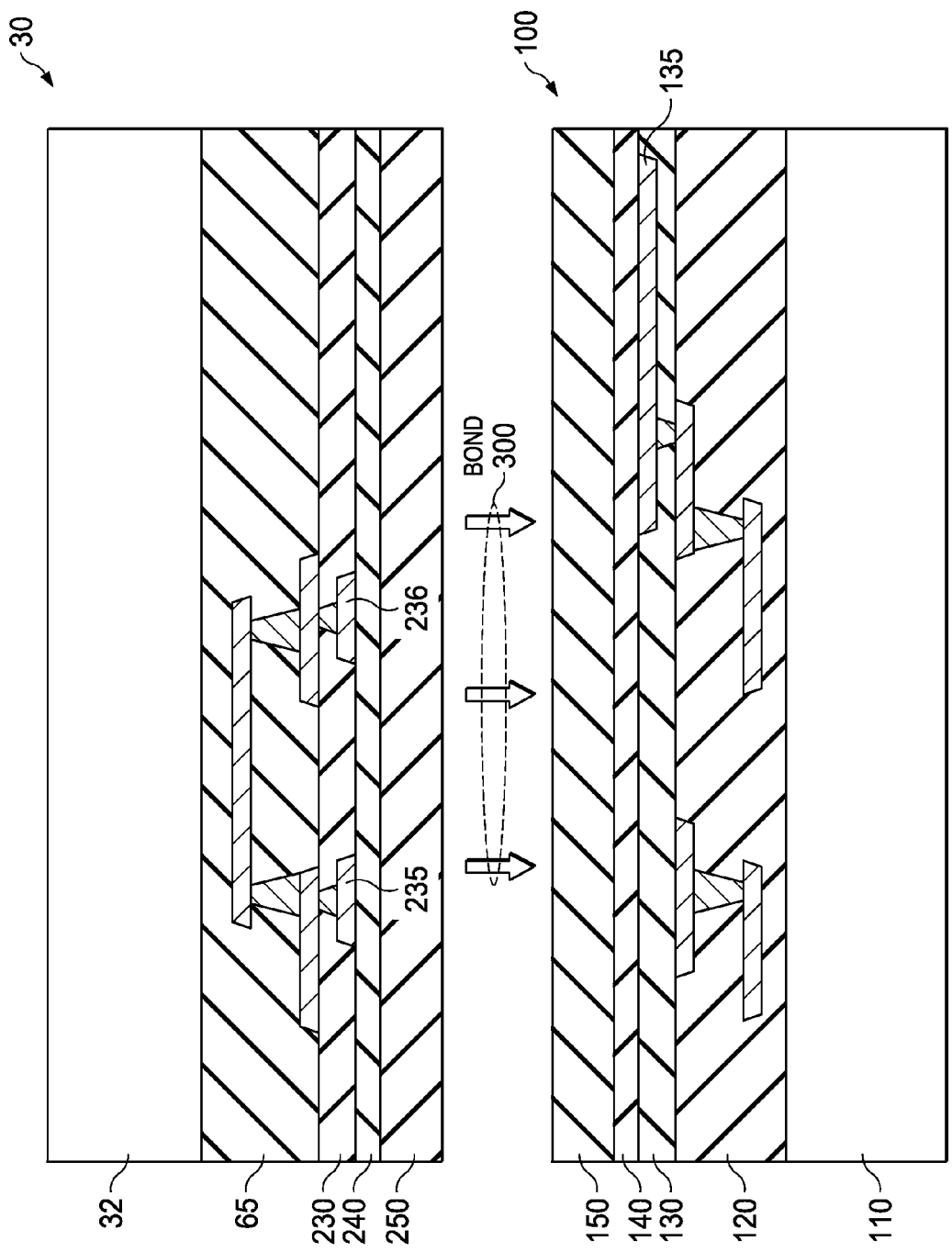

Referring to FIG. 3, an ASIC wafer 100 is provided. Unlike the traditional carrier wafer, the ASIC wafer 100 includes electronic circuitry and electrical interconnections. For example, the ASIC wafer 100 includes a substrate 110, which may be a silicon substrate. A plurality of microelectronic devices are formed at least partially in the substrate 110, such as transistors, capacitors, inductors, resistors, etc. In some embodiments, the electronic circuitry formed by these microelectronic devices may include circuitry for controlling and/or operating the sensor device 30. For reasons of simplicity, these microelectronic devices formed in the substrate 110 are not specifically illustrated herein.

The ASIC wafer 100 also includes an interconnect structure 120 that is disposed over the substrate 110. Similar to the interconnect structure 65, the interconnect structure 120 may include a plurality of interconnect layers that each contain one or more metal lines, which are electrically interconnected together by a plurality of vias. For purposes of explaining the various aspects of the present disclosure in more detail, an interconnect layer 130 of the interconnect structure 120 is illustrated. The interconnect layer 130 is the interconnect layer located at the topmost level of the interconnect structure 120. In other words, the interconnect layer 130 is located farther away from the substrate 110 than the other interconnect layers of the interconnect structure 120. As illustrated, the interconnect layer 130 includes an example metal line 135. In some embodiments, the metal line 135 contains copper (Cu).

The ASIC wafer 100 further includes an isolation (or insulation) layer 140 that is disposed on the interconnect layer 130. In the embodiment shown, the isolation layer 140 and the interconnect layer 130 are in physical or direct contact with one another. In some embodiments, the isolation layer 140 contains silicon nitride. The silicon nitride may be formed by a plasma enhanced chemical vapor deposition (PECVD) process. The isolation layer 140 serves at least two purposes. First, the isolation layer 140 may function as a barrier layer to prevent diffusion, such as diffusion of copper into silicon oxide. Second, the isolation layer 140 may function as an etching-stop layer in a later process. Each of these two purposes of the isolation layer 140 will be discussed below in more detail.

The ASIC wafer 100 also includes a dielectric layer 150 that is disposed over the isolation layer 140. In some embodiments, the dielectric layer 150 contains silicon oxide. The dielectric layer 150 may be planarized to form a smooth surface, for example by a chemical mechanical polishing (CMP) process.

The interconnect structure 65 also includes an interconnect layer 230. The interconnect layer 230 is the interconnect layer located at the topmost (herein shown at the bottom, since the interconnect structure 65 is flipped upside down) level of the interconnect structure 65. In other words, the interconnect layer 230 is located farther away from the substrate 32 than the other interconnect layers of the interconnect structure 65. As illustrated, the interconnect layer 230 includes example metal lines 235 and 236. In some embodiments, the metal lines 235-236 each contain copper (Cu).

An isolation (or insulation) layer 240 is formed on the interconnect layer 230. In the embodiment shown, the isolation layer 240 and the interconnect layer 230 are in physical or direct contact with one another. In some embodiments, the isolation layer 240 contains silicon nitride. The silicon nitride may be formed by a plasma enhanced chemical vapor deposition (PECVD) process. In other embodiments, the isolation layer 240 may contain silicon carbide or silicon oxy-nitride. The isolation layer 240 may also function as a barrier layer to prevent diffusion, such as diffusion of copper into silicon oxide, which will be discussed below in more detail.

A dielectric layer 250 is also formed over the isolation layer 240. In some embodiments, the dielectric layer 250 contains silicon oxide. The dielectric layer 250 may be planarized to form a smooth surface, for example by a CMP process.

The ASIC wafer 100 is bonded to the sensor wafer 32 in a bonding process 300. In more detail, the dielectric layer 250 is bonded to the dielectric layer 150. The smooth surfaces of the dielectric layers 150 and 250 facilitate their bonding. In some embodiments, the bonding process 300 includes a molecular force bonding, also known as direct bonding or optical fusion bonding. In other embodiments, the bonding process 300 may include other suitable bonding techniques known in the art.

As discussed above, the isolation layers 140 and 240 may serve as barrier layers to prevent or reduce copper diffusion. As can be seen in FIG. 3, had the isolation layer 140 not been formed, the copper material of the metal line 135 of the interconnect layer 130 would have come into direct contact with the oxide material of the dielectric layer 150. Similarly, had the isolation layer 240 not been formed, the copper material of the metal line 235 of the interconnect layer 230 would have come into direct contact with the oxide material of the dielectric layer 250. When copper comes into direct contact with silicon oxide, the copper material may diffuse into the silicon oxide material, which is undesirable. Copper diffusion is exacerbated by the performance of one or more high temperature thermal processes, which may be needed to complete the fabrication of the image sensor device 30. As copper diffuses into silicon oxide, the metal lines 135 or 235 may exhibit voids or pits on their surfaces. In other words, the metal lines 135 or 235 may be somewhat deformed, which will degrade their performance. Furthermore, as copper gets diffused into the silicon oxide, the silicon oxide—normally electrically insulating—may now become somewhat electrically conductive. This may lead to electrical leakage issues.

According to the various aspects of the present disclosure, the implementation of the isolation layer 140 prevents the copper material of the metal line 135 from coming into physical contact with the silicon oxide material of the dielectric layer 150, thereby effectively preventing or reducing the copper diffusion into the silicon oxide. The same is true for the isolation layer 240, as it prevents the copper material of the metal line 235 from coming into physical contact with the silicon oxide material of the dielectric layer 250. In this manner, the isolation layers 140 and 240 each serve as a barrier layer. Consequently, the metal lines 135 and 235 may be able to maintain their desired shapes and surface smoothness, and the dielectric layers 150 and 250 may still be electrically insulating so as to avoid any electrical leakage issues.

Figure 4:
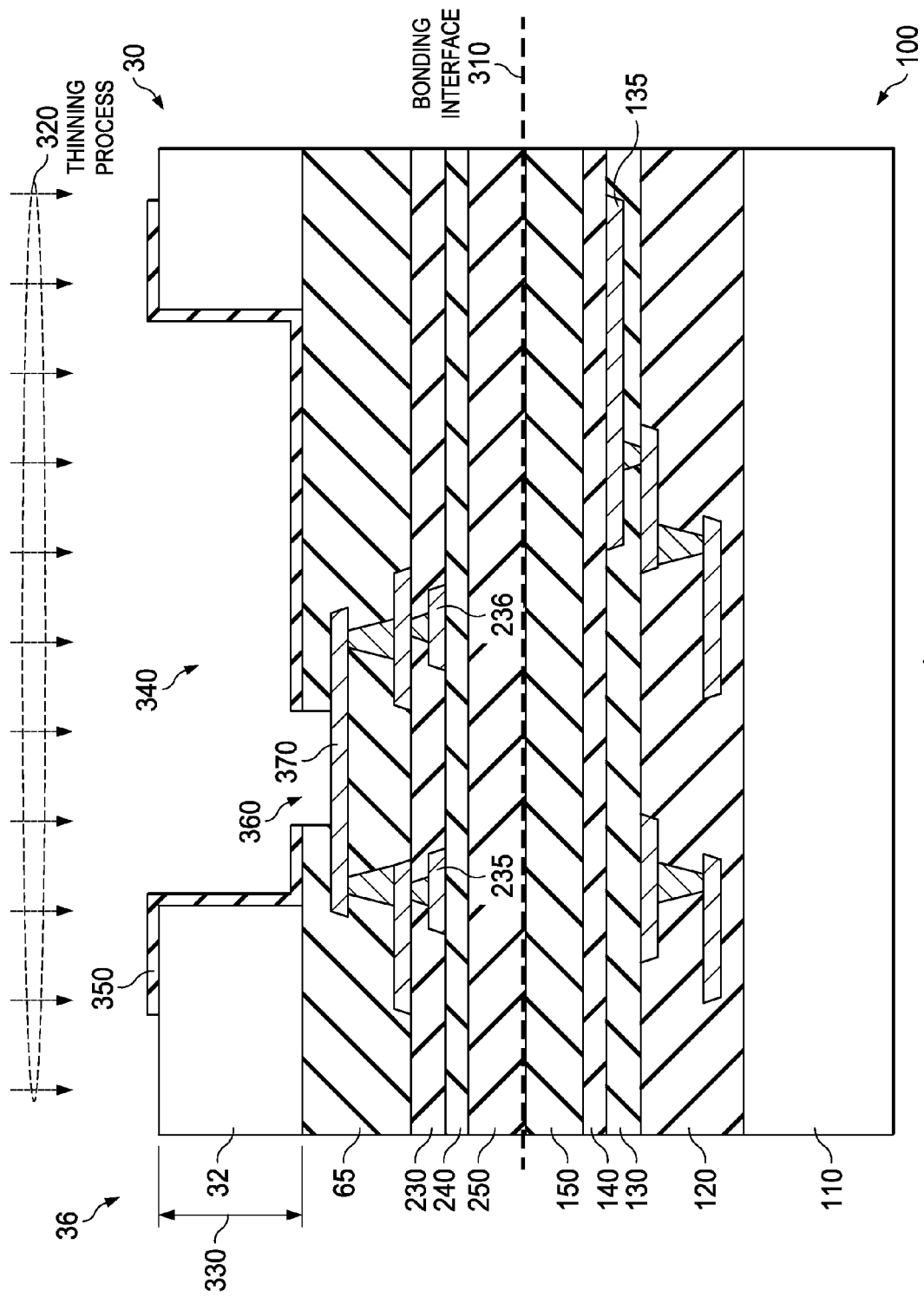

Referring now to FIG. 4, the sensor wafer 32 and the ASIC wafer 100 are bonded together, thereby forming a bonding interface 310 therebetween. In the illustrated embodiment, the bonding interface 310 exists between the bottom surface of the dielectric layer 250 and the top surface of the dielectric layer 150. The ASIC wafer 100 not only provides electrical circuitry for facilitating the operations of the image sensor device 30, but also provides protection for the various elements formed on the front side 34 of the sensor wafer 32, such as the pixels 40 and 42 (shown in FIGS. 1-2), as well as providing mechanical strength and support for processing the back side 36 of the sensor wafer 32.

In more detail, a thinning process 320 is performed to thin the sensor wafer 32 from the backside 36. The thinning process 80 may include a mechanical grinding process and a chemical thinning process. A substantial amount of substrate material may be first removed from the sensor wafer 32 during the mechanical grinding process. Afterwards, the chemical thinning process may apply an etching chemical to the back side 36 of the sensor wafer 32 to further thin the sensor wafer 32 to a reduced thickness 330 from its original thickness 38, which is on the order of a few microns. In the present embodiment, the thickness 330 is less than about 5 microns, for example about 2-3 microns. In an embodiment, the thickness 85 is greater than at least about 1 micron. It is also understood that the particular thicknesses disclosed in the present disclosure are mere examples and are not limiting, and that other thicknesses may be implemented depending on the type of application and design requirements of the image sensor device 30.

After the thinning process 320 is performed, an opening 340 (or recess) is formed in the substrate of the sensor wafer 32 from the back side 36. The opening 340 may be formed by an etching process in some embodiments. The opening 340 may vertically extend substantially through the substrate of the sensor wafer 32. The opening 340 may also be relatively wide, for example it may have a lateral dimension (or width) in a range from about 80 microns to about 90 microns. After the opening 340 is formed, a dielectric layer 350 is formed in the opening 350, as illustrated in FIG. 4. In some embodiments, the dielectric layer 350 contains silicon oxide, though other suitable materials may also be used in alternative embodiments. Thereafter, another opening 360 may be formed in the interconnect structure 65 to expose one of the metal lines 370 of an interconnect layer. The opening 360 may also be referred to as a shallow trench.

Figure 5:
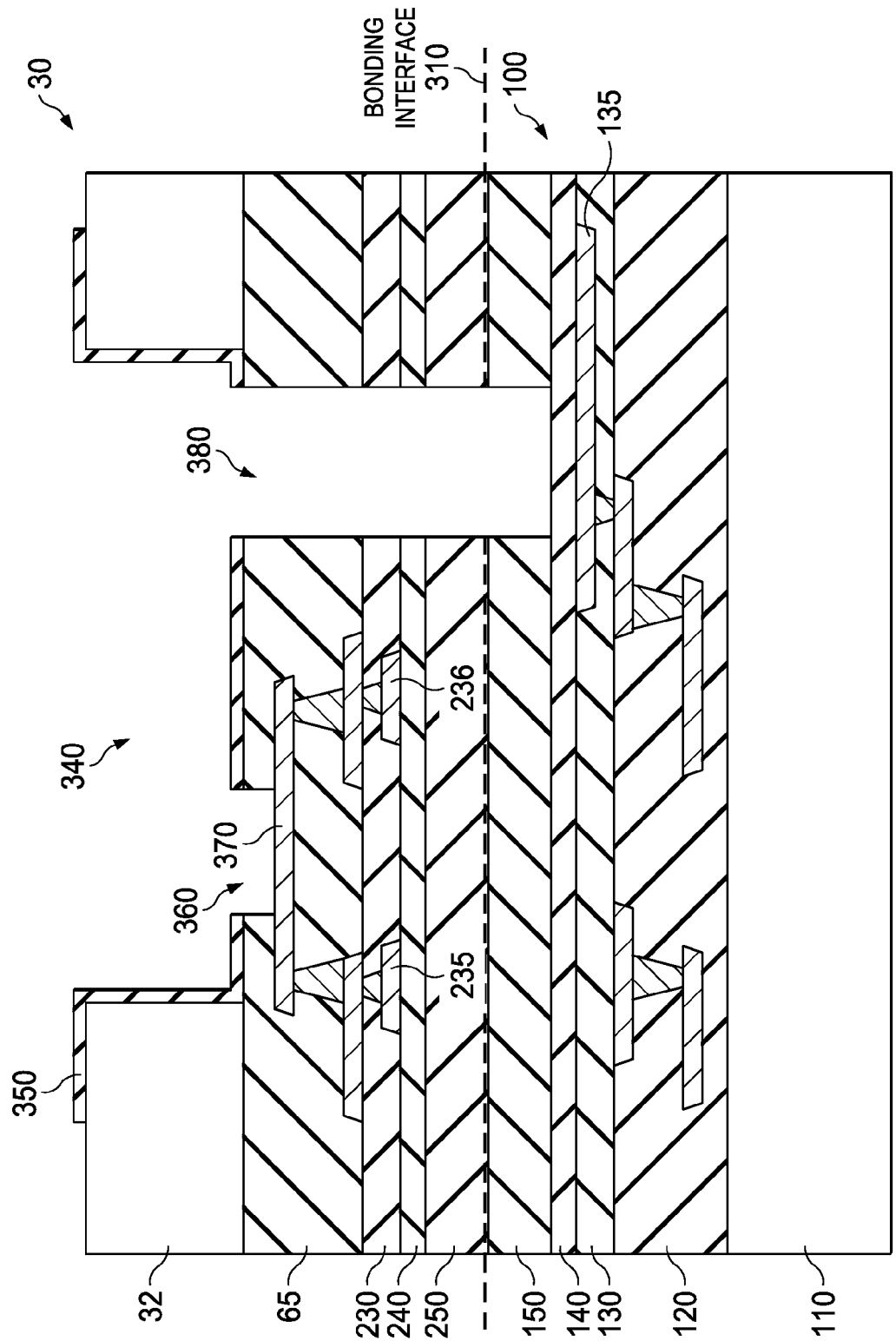

Referring now to FIG. 5, another opening 380 is formed in the sensor wafer 32. The opening 380 is formed to vertically extend through the entire sensor wafer 32 as well as the dielectric layer 150 of the ASIC wafer 100. The opening 380 may also be referred to as a deep trench and may be formed through one or more suitable etching processes. For example, in some embodiments, an etching process may be performed to form the opening 380 in the sensor wafer 32 (and the layers disposed below), followed by another etching process to extend the opening 380 to the ASIC wafer 100. In other embodiments, a single etching process may be performed to form the opening 380 through both the sensor wafer 32 and the ASIC wafer 100. The isolation layer 140 serves as an etching-stop layer during the formation of the opening 380, and as such the opening 380 exposes a portion of the isolation layer 140. One reason that the isolation layer 140 is capable of serving as the etching-stop layer herein is the high etching selectivity between itself and the other layers etched through by the etching processes, for example the dielectric layers 150 and 250. As discussed above, the isolation layer 140 contains silicon nitride in the illustrated embodiment, whereas the dielectric layers 150 and 250 each contain silicon oxide. Etchants used in the etching processes to form the opening 380 can be easily designed to have a significantly faster etching rate with respect to silicon oxide than with respect to silicon nitride. Therefore, the etching processes can easily remove the silicon oxide materials of the dielectric layers 150 and 250 but will stop when the silicon nitride material of the isolation layer 140 is reached.

Figure 6:
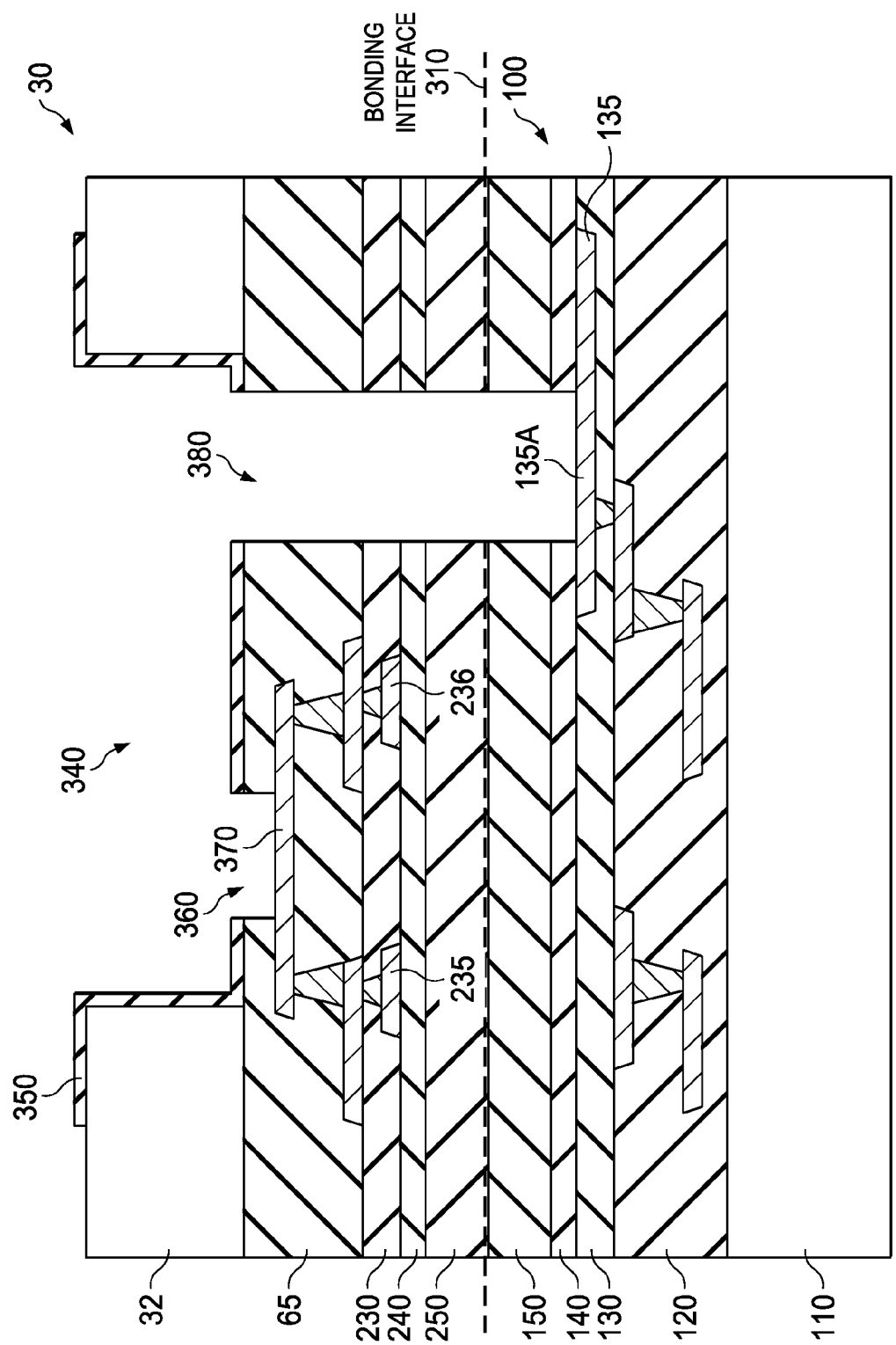

Referring now to FIG. 6, the portion of the isolation layer 140 exposed by the opening 380 is removed, for example by another etching process. This process may also be referred to as a liner removal process. As a result of the removal of the isolation layer 140 in the opening 380, a portion of the metal line 135 is now exposed by the opening 380.

Figure 7:
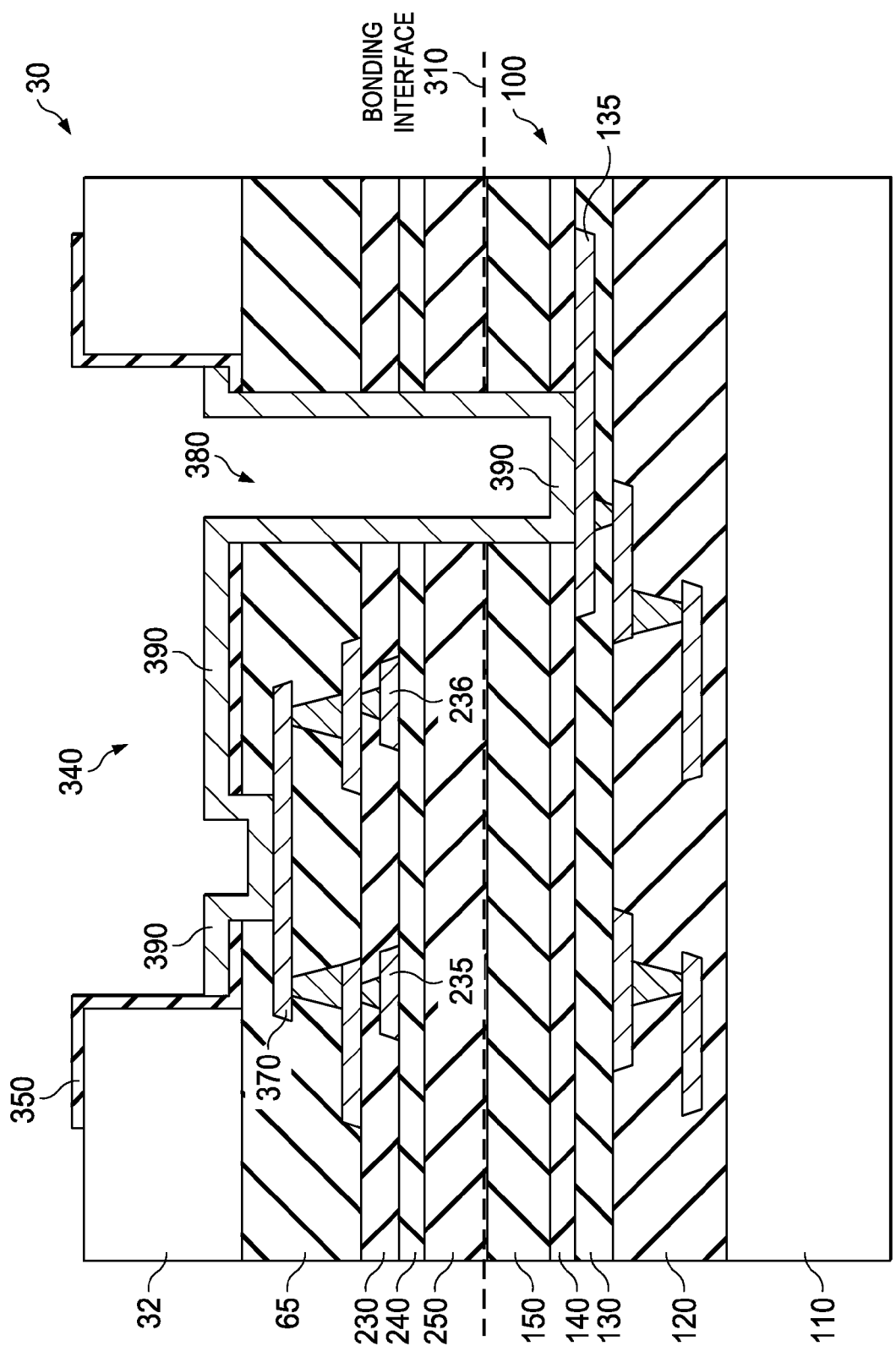

Referring now to FIG. 7, a conductive layer 390 is formed in the openings 340 and 380. The conductive layer 390 may be formed by a suitable deposition process, for example CVD, PVD, ALD, or combinations thereof. In some embodiments, the conductive layer 390 contains a metal material, for example aluminum copper (AlCu). As is illustrated in FIG. 7, the conductive layer 390 is formed to be electrically coupled with the interconnect structure 65 of the sensor wafer 32 (e.g., through physical contact with the metal line 370). The conductive layer 390 is also formed to be electrically coupled with the interconnect structure 120 of the ASIC wafer 100 (e.g., through physical contact with the metal line 135). In this manner, the sensor wafer 32 and the ASIC wafer 100 are electrically coupled together at least in part by the conductive layer 390.

FIGS. 3-7 illustrate one embodiment of establishing electrical interconnections between the sensor wafer 32 and the ASIC wafer 100. FIGS. 8-12 illustrate an alternative embodiment of establishing electrical interconnections between the sensor wafer 32 and the ASIC wafer 100. For reasons of simplicity, however, similar components and processes in both embodiments are labeled the same throughout FIGS. 3-12.

Figure 8:
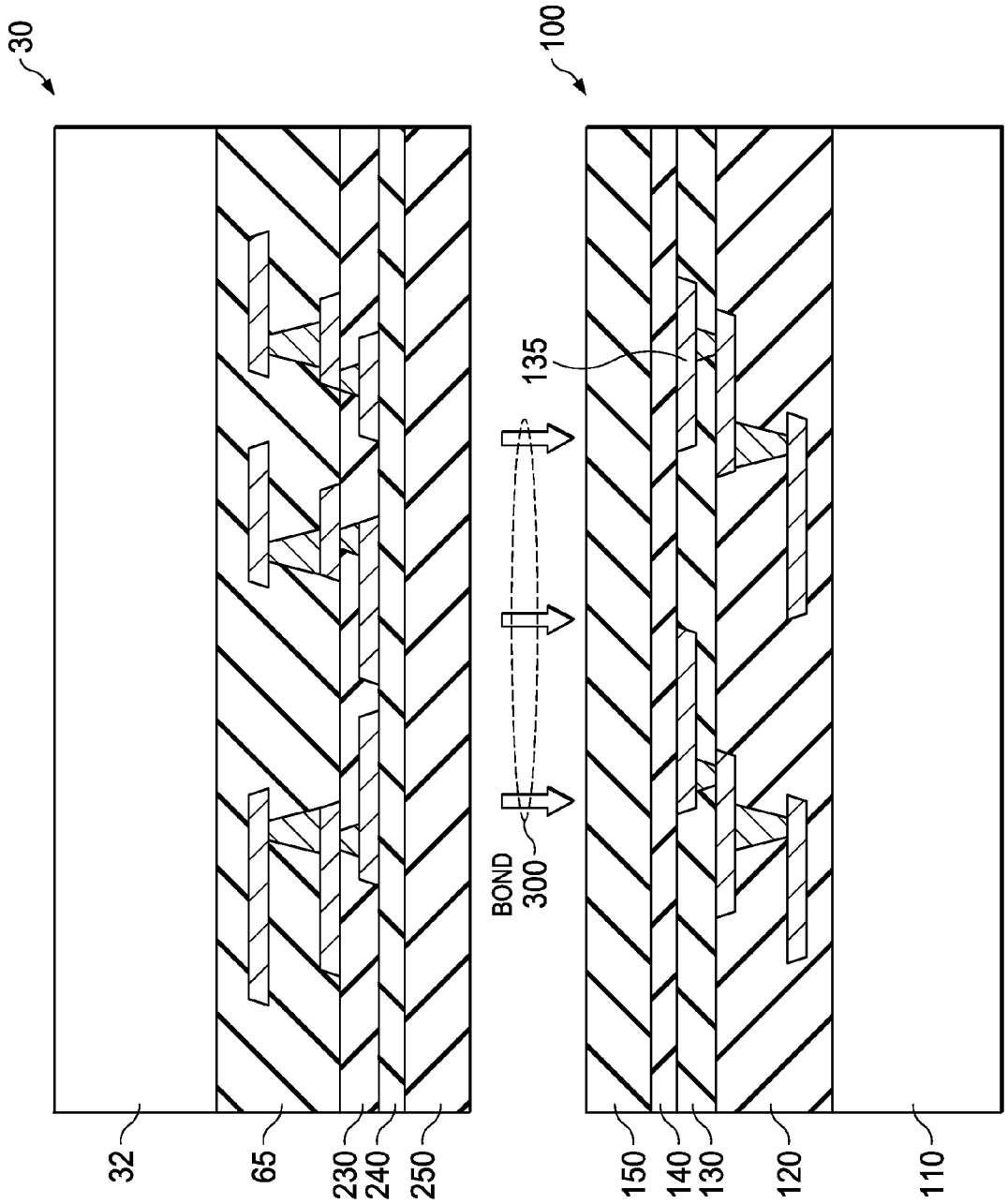

Referring to FIG. 8, an ASIC wafer 100 is provided and then bonded to the sensor wafer 32. Once again, the isolation layers 140 and 240 (e.g., containing silicon nitride) are formed on the ASIC wafer 100 and the sensor wafer 32, respectively. The dielectric layers 150 and 250 are also formed on the isolation layers 140 and 240, respectively. Similar to their roles in the embodiment discussed above in association with FIGS. 3-7, the isolation layers 140 and 240 will also serve as barrier layers to reduce copper diffusion into silicon oxide in the embodiment discussed below. The isolation layer 140 also serves as an etching stop layer in a deep trench etching process discussed below.

Figure 9:
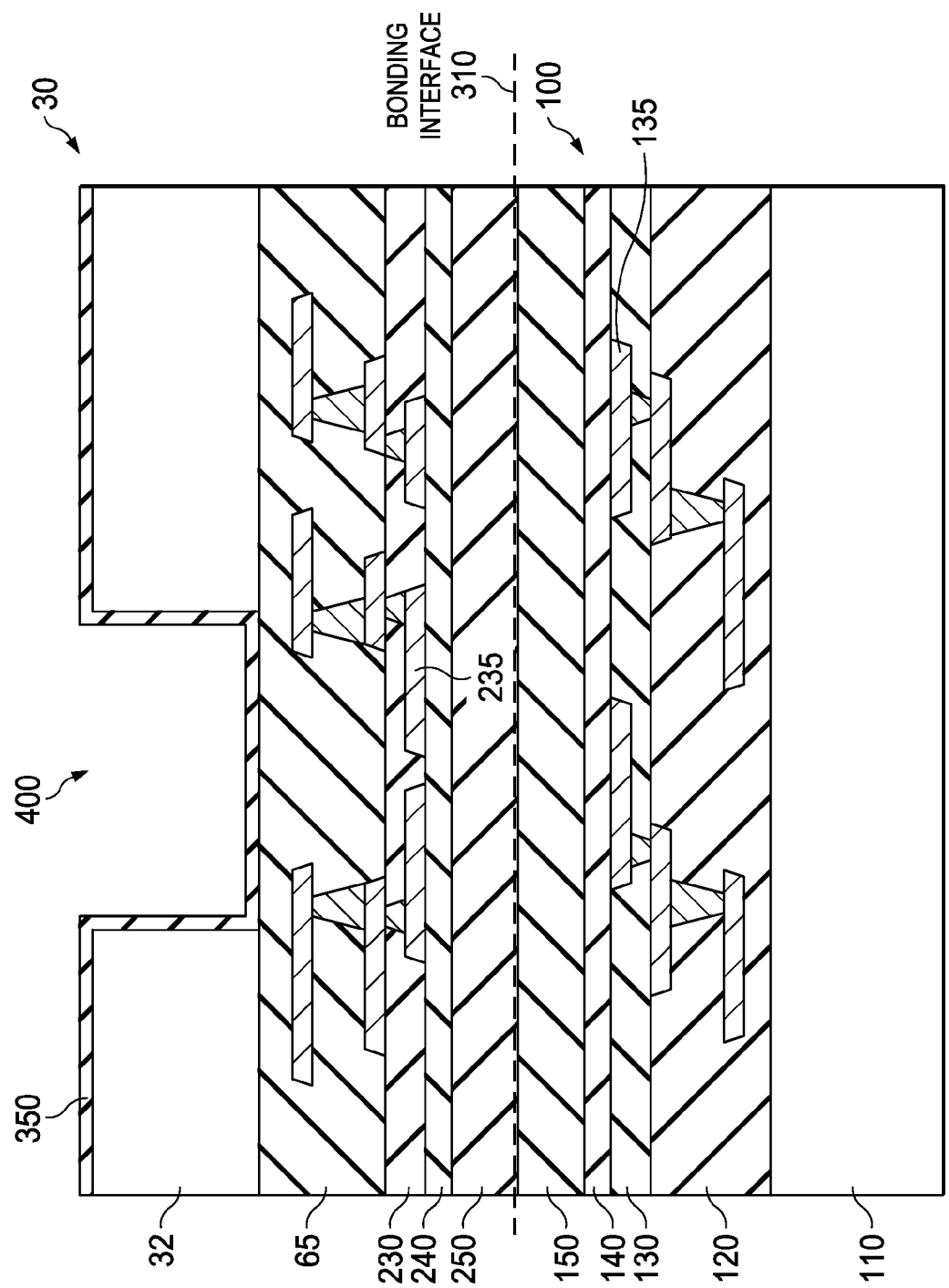

Referring now to FIG. 9, the sensor wafer 32 and the ASIC wafer 100 are bonded together. After the substrate of the sensor wafer 32 is thinned down from the back side, an opening 400 is formed in the substrate of the sensor wafer 32. Similar to the opening 340 (shown in FIG. 5), the opening 400 vertically extends substantially through the substrate of the sensor wafer 32. Unlike the opening 340, however, the opening 400 herein is substantially narrower. For example, the opening 400 may have a lateral dimension (or width) in a range from about 5 microns to about 20 microns, which is substantially less than the lateral dimension of about 80 microns to about 90 microns for the opening 340. After the opening 400 is formed, the dielectric layer 350 is formed in the opening 400 and over the back side surface of the substrate of the sensor wafer 32.

Figure 10:
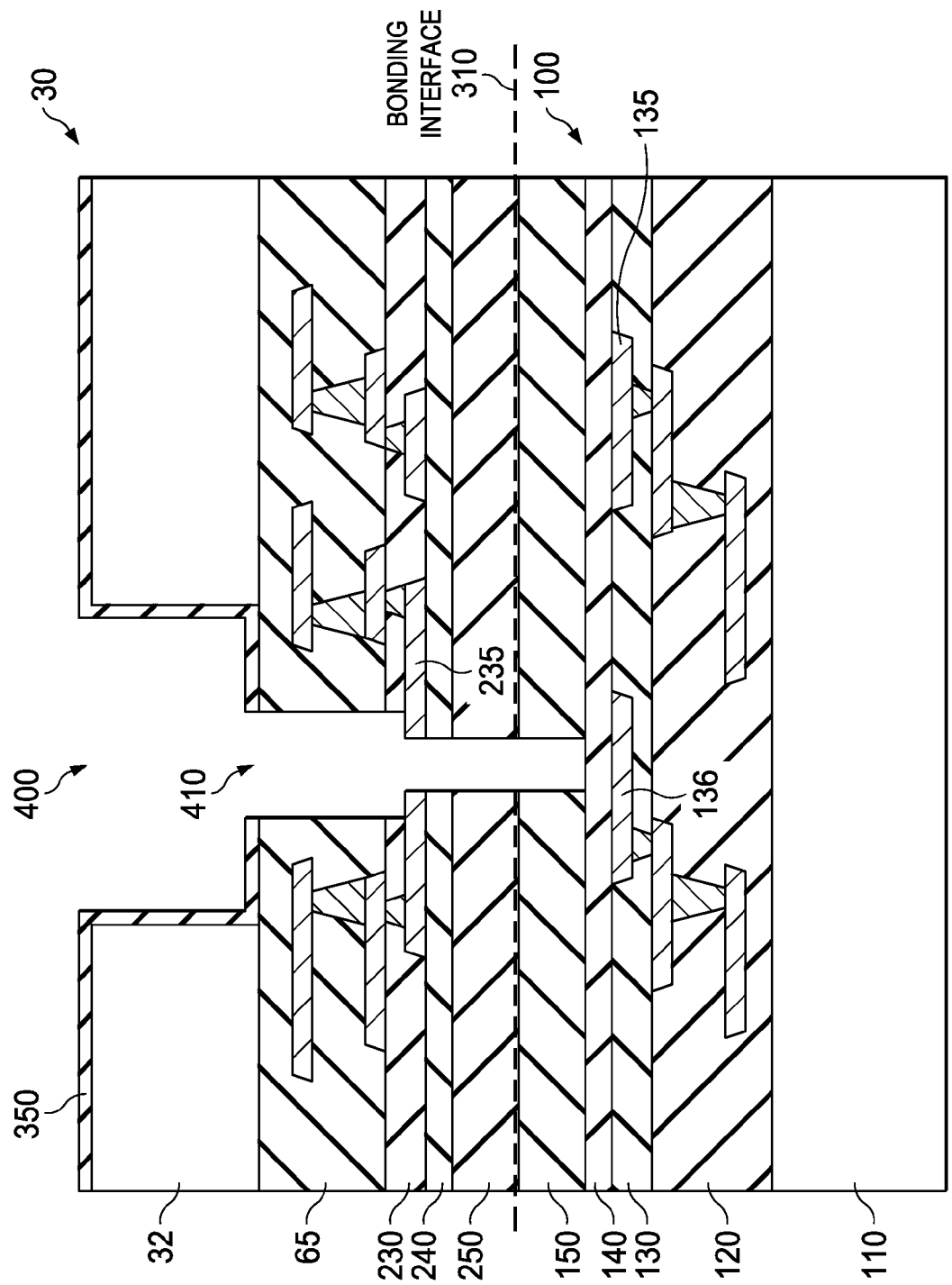

Referring now to FIG. 10, the opening 400 is extended further downward through one or more etching processes until the isolation layer 140 is reached. This process may also be referred to as a deep trench patterning or deep trench etching process. The opening 400 now contains a deep trench 410 that exposes a portion of the isolation layer 140. Again, the isolation layer 140 serves as the etching-stop layer in the deep trench etching process herein due to its high etching selectivity with the dielectric layers 150 and 250.

Figure 11:
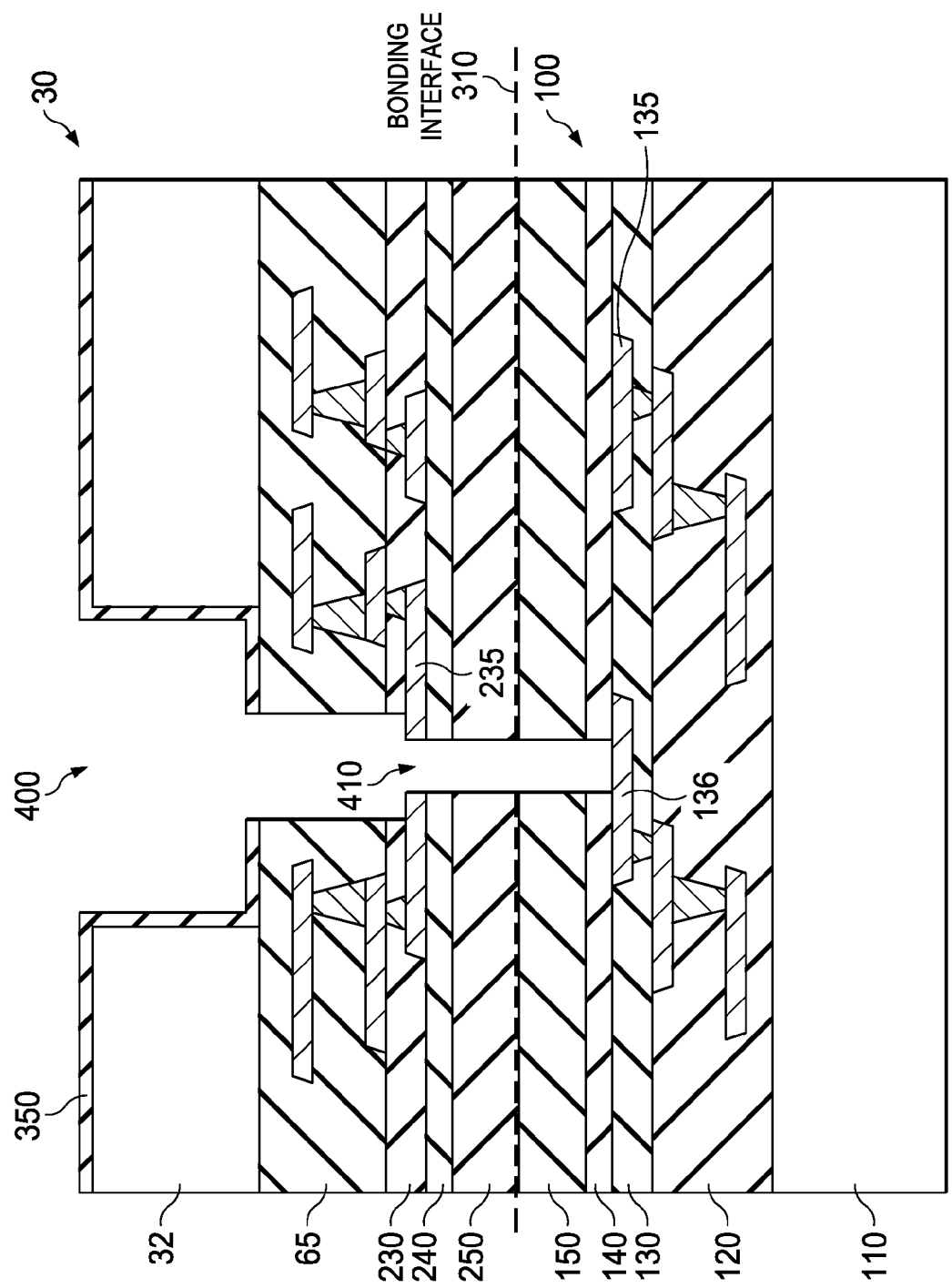

Referring now to FIG. 11, the portion of the isolation layer 140 exposed by the deep trench 410 is removed, for example by another etching process. This process may also be referred to as a liner removal process. As a result of the removal of the isolation layer 140, a portion of a metal line 136 is now exposed.

Figure 12:
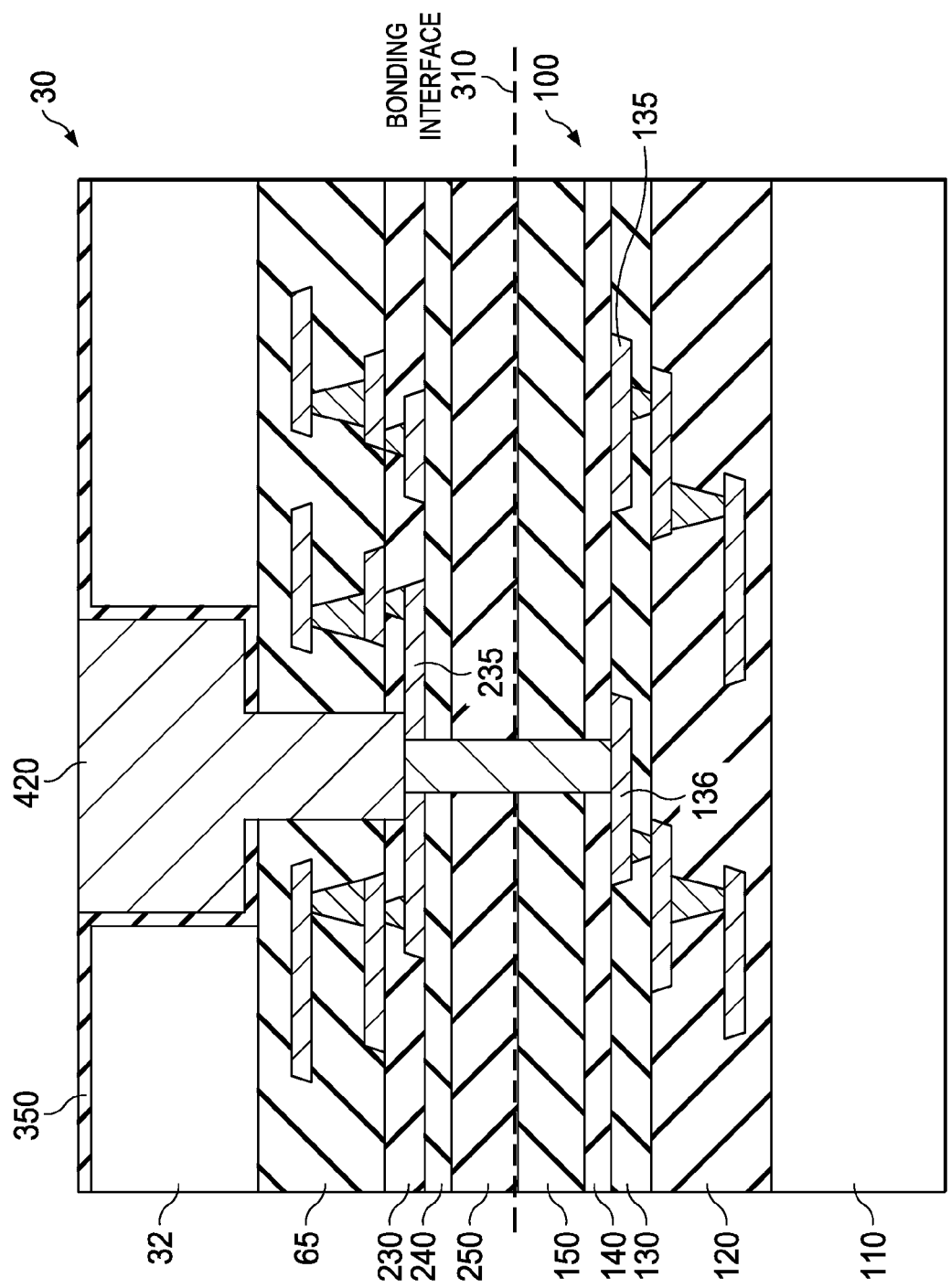

Referring now to FIG. 12, a via 420 is formed in the opening 420 (and in the deep trench 410. The via 420 may be formed by one or more suitable deposition processes, for example CVD, PVD, ALD, or combinations thereof, followed by one or more planarization processes, for example a CMP process. In some embodiments, the via 420 contains a metal material, for example copper. In alternative embodiments, other suitable conductive materials may be used. As is illustrated in FIG. 12, the via 420 is formed to be electrically coupled with the interconnect structure 65 of the sensor wafer 32 (e.g., through physical contact with the metal line 235). The via 420 is also formed to be electrically coupled with the interconnect structure 120 of the ASIC wafer 100 (e.g., through physical contact with the metal line 136). In this manner, the sensor wafer 32 and the ASIC wafer 100 are electrically coupled together at least in part by the via 420.

Figure 13:
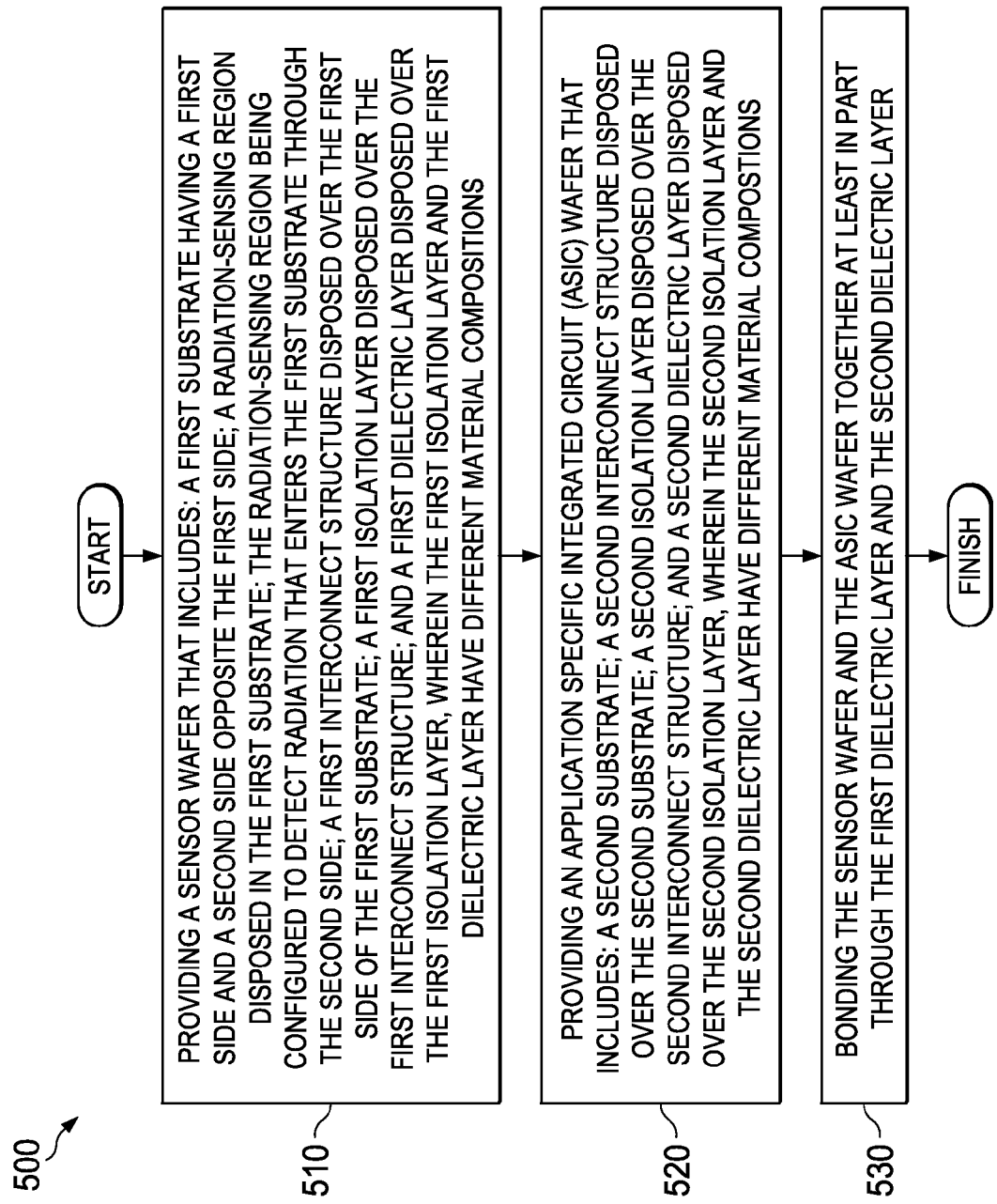
FIG. 13 is a flowchart illustrating a method of fabricating an image sensor device in accordance with some embodiments.

FIG. 13 is a simplified flowchart illustrating a method 500 of fabricating an image sensor device according to embodiments of the present disclosure. The method 500 includes a step 510 of providing a sensor wafer. The sensor wafer includes a first substrate having a first side and a second side opposite the first side. A radiation-sensing region is disposed in the first substrate. The radiation-sensing region is configured to detect radiation that enters the first substrate through the second side. The sensor wafer also includes a first interconnect structure that is disposed over the first side of the first substrate. The sensor wafer also includes a first isolation layer that is disposed over the first interconnect structure. The sensor wafer further includes a first dielectric layer that is disposed over the first isolation layer. The first isolation layer and the first dielectric layer have different material compositions.

The method 500 includes a step 520 of providing an ASIC wafer. The ASIC wafer includes a second substrate. The ASIC wafer includes a second interconnect structure that is disposed over the second substrate. The ASIC wafer further includes a second isolation layer that is disposed over the second interconnect structure. The ASIC wafer also includes a second dielectric layer that is disposed over the second isolation layer. The second isolation layer and the second dielectric layer have different material compositions.

The method 500 includes a step 530 of bonding the sensor wafer and the ASIC wafer together. The sensor wafer and the ASIC wafer are bonded together at least in part through the first dielectric layer and the second dielectric layer.

In some embodiments, the steps 510 and 520 are performed such that: the first dielectric layer and the second dielectric layer each contain silicon oxide; and the first isolation layer and the second isolation layer each contain silicon nitride.

In some embodiments, the steps 510 and 520 are performed such that: the first interconnect structure and the second interconnect structure each include a plurality of interconnect layers, and wherein each of the interconnect layers contain one or more metal lines. In some embodiments, the metal lines contain copper.

In some embodiments, the method 500 further includes the following steps: forming, in a periphery region of the image sensor that is separate from a pixel region of the image sensor in which the radiation-sensing region is disposed, a first opening that vertically extends through the first substrate, the first opening exposing a portion of the first interconnect structure; forming, in the periphery region of the image sensor, a second opening that vertically extends through the sensor wafer and through the second dielectric layer and the second isolation layer of the ASIC wafer, the second opening exposing a portion of the second interconnect structure; and forming a conductive layer in the first opening and the second opening, wherein the conductive layer is formed to be in electrical contact with both the portion of the first interconnect structure in the first opening and the portion of the second interconnect structure in the second opening.

In some embodiments, the method 500 further includes the following steps: forming, in a periphery region of the image sensor that is separate from a pixel region of the image sensor in which the radiation-sensing region is disposed, a conductive via that vertically extends from the second side of the first substrate to the second interconnect structure, wherein the conductive via is formed to be in electrical contact with both the first interconnect structure and second interconnect structure.

It is understood that additional process steps may be performed before, during, or after the steps 510-530 discussed above to complete the fabrication of the semiconductor device. For example, the step 510 of providing the sensor wafer may include various steps of forming the radiation-sensing region in the first substrate, forming the first isolation layer and forming the first dielectric layer, etc. The step 520 of providing the ASIC wafer may include various steps of forming microelectronic components in the second substrate, forming the second isolation layer and forming the second dielectric layer, etc. In addition, after the bonding step 530 is performed, the method 500 may further include a wafer thinning process to thin the first substrate from the second side, as well as one or more wafer dicing, testing, and/or packaging processes. Other process steps are not discussed herein for reasons of simplicity.

The embodiments of the present disclosure discussed above offer advantages over existing art, though it is understood that different embodiments may offer other advantages, not all advantages are necessarily discussed herein, and that no particular advantage is required for all embodiments. One of the advantages is that the present disclosure utilizes an isolation layer, for example the isolation layers 140 and 240, to serve as barrier layers. As discussed above, without these isolation layers 140 and 240, the copper material of the metal lines of the interconnect structures may diffuse into a neighboring silicon oxide layer. The copper diffusion leads to surface unevenness or voids in these metal lines, thereby degrading the performance of the image sensor device 30. Here, the silicon nitride material of the isolation layers 140 and 240 effectively prevent or reduce such copper diffusion, thereby improving the performance of the image sensor device 30. Another advantage is that the isolation layer 140 may also serve as an etching-stop layer in the deep trench formation processes. This simplifies fabrication process flow. Other advantages include compatibility with existing technologies, and therefore neither cost nor fabrication time is increased. In addition, the stacked CIS approach (i.e., by bonding the ASIC wafer 100 and the sensor wafer 32 together) allows integration with different characteristic devices or substrates on one chip. The stacked CIS approach also offers reduction in metal routing and chip area.

One embodiment of the present disclosure pertains to an image sensor. The image sensor includes a sensor portion. The sensor portion includes a first substrate having a first side and a second side opposite the first side. A radiation-sensing region is formed in the first substrate. The radiation-sensing region is configured to detect radiation that enters the first substrate through the second side. The sensor wafer includes a first interconnect structure that is disposed over the first side of the first substrate. The sensor wafer also includes a first isolation layer that is disposed over the first interconnect structure. The sensor wafer further includes a first dielectric layer that is disposed over the first isolation layer. The first isolation layer and the first dielectric layer have different material compositions. The image sensor also includes an ASIC portion. The ASIC portion includes a second substrate, a second interconnect structure disposed over the second substrate, a second isolation layer disposed over the second interconnect structure, and a second dielectric layer disposed over the second isolation layer. The second isolation layer and the second dielectric layer have different material compositions. The sensor portion and the ASIC portion are bonded together at least in part through the first dielectric layer and the second dielectric layer.

Another embodiment of the present disclosure pertains to an image sensor. The image sensor includes a sensor portion. The sensor portion includes a first substrate having a front side and a back side. A pixel is formed the first substrate. The pixel is configured to sense light that is projected toward the first substrate from the back side. The pixel is disposed in a pixel-array region of the image sensor. The sensor portion includes a first interconnect structure disposed over the front side of the first substrate. The first interconnect structure contains a plurality of first interconnect layers. The sensor portion also includes a first silicon nitride layer disposed over the first interconnect structure. The sensor portion further includes a first silicon oxide layer disposed over the first silicon nitride layer. The image sensor also includes an Application Specific Integrated Circuit (ASIC) portion. The ASIC portion includes a second substrate that contains a plurality of microelectronic devices therein. The ASIC portion includes a second interconnect structure disposed over the second substrate. The second interconnect structure contains a plurality of second interconnect layers. The ASIC portion also includes a second silicon nitride layer disposed over the second interconnect structure. The ASIC portion further includes a second silicon oxide layer disposed over the second silicon nitride layer. The sensor portion and the ASIC portion are bonded together in a manner such that a bonding interface exists the first silicon oxide layer and the second silicon oxide layer.

Yet another embodiment of the present disclosure pertains to a method of fabricating an image sensor. The method includes a step of providing a sensor wafer that includes: a first substrate having a first side and a second side opposite the first side; a radiation-sensing region disposed in the first substrate, the radiation-sensing region being configured to detect radiation that enters the first substrate through the second side; a first interconnect structure disposed over the first side of the first substrate; a first isolation layer disposed over the first interconnect structure; and a first dielectric layer disposed over the first isolation layer, wherein the first isolation layer and the first dielectric layer have different material compositions. The method also includes a step of providing an Application Specific Integrated Circuit (ASIC) wafer that includes: a second substrate; a second interconnect structure disposed over the second substrate; a second isolation layer disposed over the second interconnect structure; and a second dielectric layer disposed over the second isolation layer, wherein the second isolation layer and the second dielectric layer have different material compositions. The method further includes a step of bonding the sensor wafer and the ASIC wafer together at least in part through the first dielectric layer and the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a sensor portion that includes:
a first substrate having a first side and a second side opposite the first side;
a radiation-sensing region formed in the first substrate, the radiation-sensing region being configured to detect radiation that enters the first substrate through the second side;
a first interconnect structure disposed over the first side of the first substrate, the first interconnect structure including one or more first metal lines;
a first isolation layer disposed over the first interconnect structure; and
a first dielectric layer disposed over the first isolation layer, wherein the first isolation layer and the first dielectric layer have different material compositions;

an Application Specific Integrated Circuit (ASIC) portion that includes:
a second substrate;
a second interconnect structure disposed over the second substrate, the second interconnect structure including one or more second metal lines;
a second isolation layer disposed over the second interconnect structure; and
a second dielectric layer disposed over the second isolation layer, wherein the second isolation layer and the second dielectric layer have different material compositions;
wherein the sensor portion and the ASIC portion are bonded together at least in part through a bonding interface formed by the first dielectric layer and the second dielectric layer; and
a conductive via that extends through the bonding interface, wherein the conductive via is electrically coupled to both the first interconnect structure and the second interconnect structure, the conductive via being in direct physical contact with one of the first metal lines and one of the second metal lines, the one of the first metal lines being disposed between the first isolation layer and the first substrate, the one of the second metal lines having a smaller lateral dimension than the second isolation layer.

2. The image sensor of claim 1, wherein the image sensor comprises a back side illuminated (BSI) image sensor.

3. The image sensor of claim 1, wherein:
the first dielectric layer and the second dielectric layer each contain silicon oxide; and
the first isolation layer and the second isolation layer each contain silicon nitride.

4. The image sensor of claim 1, wherein the first metal lines or second metal lines contain copper.

5. The image sensor of claim 1, wherein:
the radiation-sensing region is disposed in a pixel region of the image sensor; and
the conductive via is disposed in a periphery region of the image sensor.

6. The image sensor of claim 1, wherein the conductive via extends through both the first isolation layer and the second isolation layer.

7. The image sensor of claim 1, wherein the first interconnect structure and the second interconnect structure are disposed between the first substrate and the second substrate.

8. The image sensor of claim 1, wherein the second isolation layer is in direct physical contact with the second dielectric layer.

9. The image sensor of claim 1, wherein the conductive via comprises three distinctly different segments, each of the three segments having a respective lateral dimension that is different from the other segments.

10. An image sensor, comprising:
a sensor portion that includes:
a first substrate having a front side and a back side;
a pixel formed the first substrate, the pixel being configured to sense light that is projected toward the first substrate from the back side, wherein the pixel is disposed in a pixel-array region of the image sensor;
a first interconnect structure disposed over the front side of the first substrate, the first interconnect structure containing a plurality of first interconnect layers;
a first silicon nitride layer disposed over the first interconnect structure; and a first silicon oxide layer disposed over the first silicon nitride layer;

an Application Specific Integrated Circuit (ASIC) portion that includes:
- a second substrate that contains a plurality of microelectronic devices therein;
- a second interconnect structure disposed over the second substrate, the second interconnect structure containing a plurality of second interconnect layers;
- a second silicon nitride layer disposed over the second interconnect structure; and
- a second silicon oxide layer disposed over the second silicon nitride layer, the second silicon oxide layer being in direct physical contact with the second silicon nitride layer;

wherein the sensor portion and the ASIC portion are bonded together in a manner such that a bonding interface exists between the first silicon oxide layer and the second silicon oxide layer; and a conductive via that extends through the bonding interface, wherein the conductive via is electrically coupled to both the first interconnect structure and the second interconnect structure, and wherein a portion of the conductive via is in direct physical contact with one of the first interconnect layers that is located between the first silicon nitride layer and the first substrate.

11. The image sensor of claim 10, wherein the sensor portion is in electrical communication with the ASIC portion.

12. The image sensor of claim 10, wherein the conductive via is located outside the pixel-array region of the image sensor.

13. The image sensor of claim 10, wherein:
the conductive via extends through both the first silicon nitride layer and the second silicon nitride layer; and
the first interconnect structure and the second interconnect structure are disposed between the first substrate and the second substrate.

14. A method of fabricating an image sensor, comprising:
providing a sensor wafer that includes:
- a first substrate having a first side and a second side opposite the first side;
- a radiation-sensing region disposed in the first substrate, the radiation-sensing region being configured to detect radiation that enters the first substrate through the second side;
- a first interconnect structure containing a plurality of first conductive interconnect segments disposed over the first side of the first substrate;
- a first isolation layer disposed over the first interconnect structure; and
- a first dielectric layer disposed over the first isolation layer, wherein the first isolation layer and the first dielectric layer have different material compositions; and providing an Application Specific Integrated Circuit (ASIC) wafer that includes:
- a second substrate;
- a second interconnect structure containing a plurality of second conductive interconnect segments disposed over the second substrate;
- a second isolation layer disposed over the second interconnect structure; and
- a second dielectric layer disposed over, and being in direct physical contact with, the second isolation layer, wherein the second isolation layer and the second dielectric layer have different material compositions;

bonding the sensor wafer and the ASIC wafer together at least in part through the first dielectric layer and the second dielectric layer; and forming a conductive via that extends through a bonding interface formed by the first dielectric layer and the second dielectric layer, wherein the conductive via is formed to be in direct physical contact with one of the first conductive interconnect segments and with one of the second conductive interconnect segments, wherein the one of the first conductive interconnect segments is disposed between the first isolation layer and the first substrate.

15. The method of claim 14, further comprising: after the bonding, thinning the first substrate from the second side.

16. The method of claim 14, wherein the providing the sensor wafer and the providing the ASIC wafer are performed such that:
the first dielectric layer and the second dielectric layer each contain silicon oxide; and
the first isolation layer and the second isolation layer each contain silicon nitride.

17. The method of claim 14, wherein the first and second conductive interconnect segments each contain copper.

18. The method of claim 14, wherein the conductive via is formed in a periphery region of the image sensor that is separate from a pixel region of the image sensor.

19. The method of claim 14, wherein the conductive via is formed to extend through both the first isolation layer and the second isolation layer.

20. The method of claim 14, wherein the first interconnect structure and the second interconnect structure are disposed between the first substrate and the second substrate.

* * * * *